(12) United States Patent
Hwang et al.

(10) Patent No.: US 7,606,036 B2
(45) Date of Patent: Oct. 20, 2009

(54) HEAT DISSIPATION DEVICE

(75) Inventors: Ching-Bai Hwang, Tu-Cheng (TW); Jin-Gong Meng, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 622 days.

(21) Appl. No.: 11/308,916

(22) Filed: May 25, 2006

(65) Prior Publication Data

US 2007/0272395 A1    Nov. 29, 2007

(51) Int. Cl.
*H05K 7/20* (2006.01)
*H01L 23/34* (2006.01)
*F28D 15/00* (2006.01)

(52) U.S. Cl. .................. 361/719; 165/80.2; 165/104.33; 165/185; 257/719

(58) Field of Classification Search ............ 165/104.33; 361/700
See application file for complete search history.

(56) References Cited

U.S. PATENT DOCUMENTS

| | | | |
|---|---|---|---|
| 5,307,236 A * | 4/1994 | Rio et al. ..................... 361/720 |
| 6,125,035 A | 9/2000 | Hood, III et al. | |
| 6,883,594 B2 * | 4/2005 | Sarraf et al. ........... 165/104.33 |
| 6,966,363 B2 * | 11/2005 | Gailus et al. ................. 165/185 |
| 6,977,814 B2 * | 12/2005 | Hornung ...................... 361/690 |
| 6,985,359 B2 * | 1/2006 | Delano et al. ............... 361/704 |
| 2004/0188079 A1 | 9/2004 | Chiou et al. | |
| 2004/0201958 A1 | 10/2004 | Lev | |
| 2005/0068741 A1 * | 3/2005 | Bailey et al. ................ 361/719 |
| 2005/0077617 A1 * | 4/2005 | Hirano et al. ............... 257/712 |
| 2006/0082972 A1 * | 4/2006 | Kim ........................... 361/709 |
| 2007/0253769 A1 * | 11/2007 | Hwang et al. ............... 403/326 |

* cited by examiner

*Primary Examiner*—Gregory D Thompson
(74) *Attorney, Agent, or Firm*—Frank R. Niranjan

(57) ABSTRACT

A heat dissipation device includes a thermal attach block (10), a heat pipe (30) thermally attached to the block, and a fin unit (90) thermally attached to the heat pipe. The block includes a curve-shaped bottom surface (124) allowing it to be thermally attached to a heat generating component (80) to absorb heat therefrom, and a top surface (122) opposite to the bottom surface. The heat pipe includes an evaporating section (32) at one end and a condensing section (34) at the other. The evaporating section can be thermally attached to the top surface of the block. The condensing section can be thermally attached to the fin unit.

13 Claims, 3 Drawing Sheets

HEAT DISSIPATION DEVICE

FIELD OF THE INVENTION

The present invention relates generally to heat dissipation devices, and in particular to a heat dissipation device with an improved thermal attach block for achieving a high heat-dissipation efficiency.

DESCRIPTION OF RELATED ART

With the advance of large scale integrated circuit technology, and the wide spread use of computers in all trades and occupations, in order to meet the required improvement in data processing load and request-response times, high speed processors have become faster and faster, which causes the processors to generate redundant heat. Redundant heat which is not quickly removed will have tremendous influence on the system security and performance. To solve this problem of heat generated by the processor, a heat dissipation device is often mounted on the processor to dissipate heat generated thereby.

A conventional heat dissipation device includes a heat radiator, such as heat pipe or fins, thermally contacting with the processor to absorb heat therefrom, and a fan mounted on the heat radiator for generating forced airflow to the heat radiator. For enhancing the heat dissipation capability of the heat radiator, a thermal attach block is arranged between the heat radiator and the processor, which is made of a material having a heat conductivity higher than that of the heat radiator, thus enhancing the speed of heat transfer from the processor to the heat radiator. The block forms a planar-shaped bottom surface thermally attached to an outer surface of the processor. A clip is mounted on the block for locking the block with a circuit board on which the processor is mounted. The clip includes locking portions abutting against two opposite sides or four corners of the block. Thus the pressure putting on the contacting portion of the block is larger than that put on the other portions of the block. Therefore the pressure put on the central portion of the processor is smaller than that put on the peripheral portion of the processor due to the uneven pressure on the block. In other words, the peripheral portion of the block contacts the processor more intimately than the central portion of the block. Therefore a relatively larger thermal resistance is formed between the central portion of the block and the processor than between the peripheral portion and the processor. However, usually the core of the processor is located in the central portion thereof and aligns with the central portion of the block. Especially for the dual-core processor, the central portion of the processor has two heat generating cores. Thus the central portion of the processor forms a hot area. This results in a hotspot in the processor in the central portion thereof, which may influence the efficiency and safety of the processor.

What is needed, therefore, is a heat dissipation device having a thermal attach block which can be attached intimately to the whole of the heat generating component.

SUMMARY OF THE INVENTION

According to a preferred embodiment of the present invention, a heat dissipation device comprises an thermal attach block, a heat pipe thermally attached to the block, and a fin unit thermally attached to the heat pipe. The block comprises a convex bottom surface allowing it to be thermally attached to a heat generating component to absorb heat therefrom, and a top surface opposite to the bottom surface. The heat pipe comprises an evaporating section at one end and a condensing section at the other. The evaporating section thermally attaches to the top surface of the block. The condensing section thermally attaches to the fin unit. The convex bottom surface is bent to be flat when the block is secured to the heat generating component by a clip exerting a force on two lateral sides of the block, whereby a pressure is put on a central portion of the heat generating component by a central portion of the block. Hotspots in the central portion of the heat generating component can therefore be in intimate contact with the bottom surface of the block. This device can improve both the efficiency and the safety of the heat generating component.

Other advantages and novel features of the present invention will be drawn from the following detailed description of the preferred embodiment of the present invention with attached drawings, in which:

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the present heat dissipation device. Moreover, in the drawings, like reference numerals designate corresponding parts throughout the several views.

DETAILED DESCRIPTION OF THE INVENTION

Figure 1:
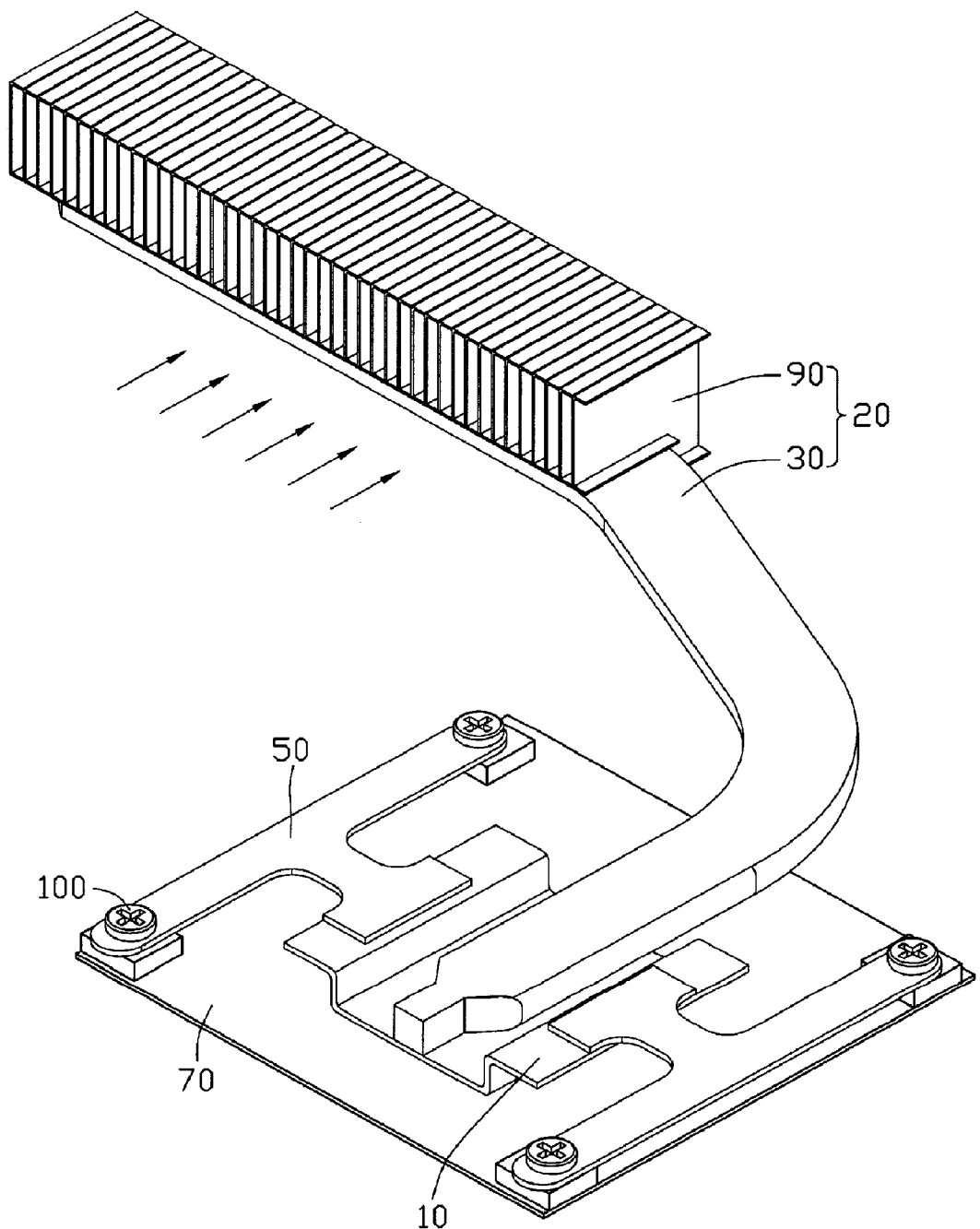
FIG. 1 is an isometric, assembled view of a heat dissipation device arranged on a heat generating component in accordance with a preferred embodiment of the present invention.

Referring to FIG. 1, a heat dissipation device according to a preferred embodiment of the present invention includes a thermal attach block 10, a heat radiator 20 being thermally attached to the block 10, and a pair of clips 50 for locking the block 10 with a circuit board 70.

Figure 2:
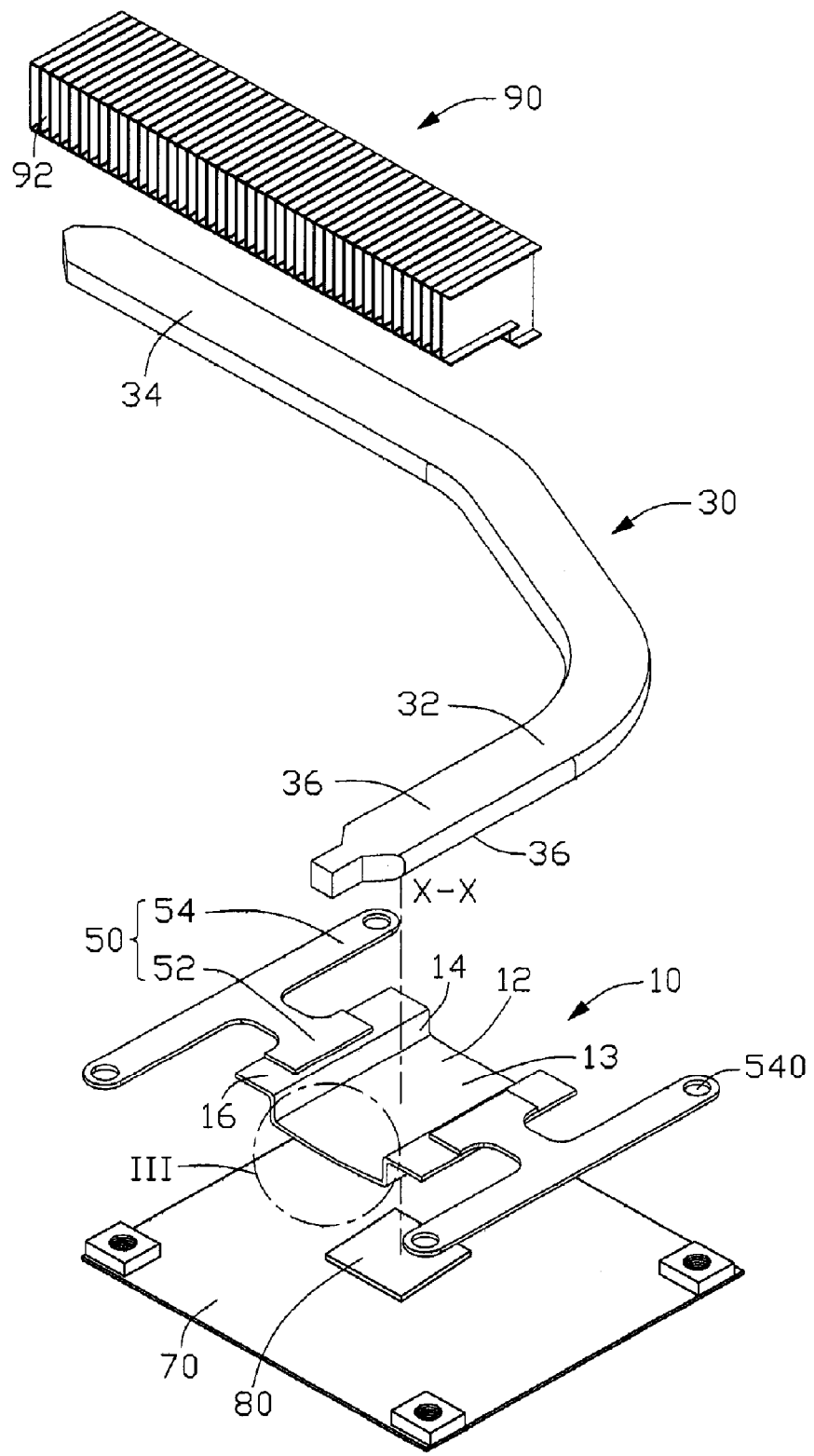
FIG. 2 is an exploded view of FIG. 1.
Figure 3:
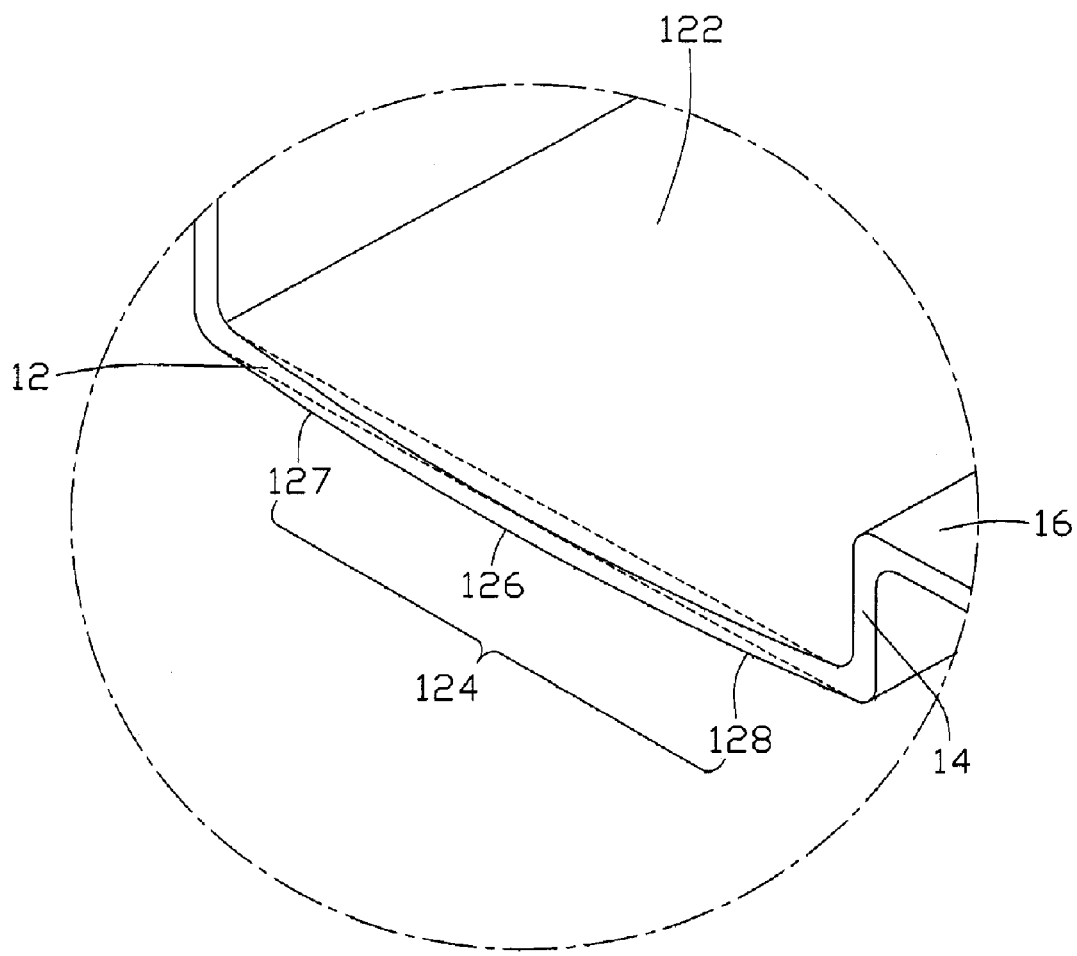
FIG. 3 is an enlarged view of a circled portion III of FIG. 2.

Referring to FIGS. 2-3, the block 10 is thermally attached to a heat generating component, such as a CPU 80 (central process unit) which is mounted on the circuit board 70. The block 10 is made of a material having relatively higher heat conductivity, such as copper or aluminum. The block 10 includes a basewall 12 and a pair of sidewalls 14 extending perpendicularly from two opposite sides (i.e. left and right sides) of the basewall 12, respectively. Cooperatively the basewall 12 and the sidewalls 14 define a space 13 receiving the heat pipe 30 therein. The basewall 12 is approximately square-shaped and defines a central axis X-X. A top and bottom surfaces 122, 124 are formed at top and bottom sides of the basewall 12, respectively. The bottom surface 124 is approximately paraboloid-shaped and is symmetric to the axis X-X of the basewall 12. Along the axis X-X of the basewall 12, a central portion 126 of the bottom surface 124 is lower than the left and right portions 127, 128 which are adjacent to the sidewalls 14 of the base 10, wherein the broken line in FIG. 3 refers a normal or ideal situation of the basewall 12 where no curvature is formed. A flange 16 extends outwardly and transversely from a top end of each sidewall 14. The flanges 16 are approximately perpendicular to the sidewalls 14, and are proximately parallel to the basewall 12 of the block 10.

The clips 50 are substantially T-shaped. Each clip 50 includes a connecting portion 52 engaging with a corresponding flange 16 of the block 12 and a mounting portion 54 extending transversely from the connecting portion 52. Each connecting portion 52 of the clips 50 fixedly engages with a middle portion of each flange 16, and extends outwardly and transversely therefrom. The connecting portions 52 and the flanges 16 are fixedly connected together by riveting. Alternatively, the connecting portions 52 and the flanges 16 can be assembled together by soldering or screwing. The mounting portions 54 are approximately parallel to the flanges 16. A mounting hole 540 is defined in each of two opposite ends of each mounting portion 54. The mounting holes 540 are symmetric to the axis X-X of the block 10.

The heat radiator 20 includes a heat pipe 30 and a fin unit 90. The heat pipe 30 includes an evaporating section 32 and a condensing section 34 at two ends thereof, respectively. A wick structure (not shown) is disposed in the heat pipe 30 with working fluid (not shown) filled therein. A planar shaped contacting surface 36 is formed on two opposite sides (i.e. top and bottom sides) of the heat pipe 30 for increasing the contacting area of the heat pipe 30 and the attach block 10 and the fin unit 90. The evaporating section 32 is received in the space 13 of the block 10 with the contacting surface 36 thermally attached to the top surface 122 of the block 10. The condensing section 34 extends outwardly and is thermally attached to the fin unit 90. The fin unit 90 includes a plurality of fins (not labeled) parallel to each other, and a flow channel 92 is defined between every two neighboring fins. A cooling fan (not shown) is arranged at a side communicating with the channels 92 for generating an airflow through the fin unit 90.

Also referring to FIG. 1, when assembled, the block 10 is arranged on the CPU 80 with the bottom surface 124 thereof thermally contacting the outer surface (i.e., top surface) of the CPU 80. The central portion 126 of the bottom surface 124 faces the central portion of the CPU 80, whilst the left and right side portions 127, 128 face the peripheral portion of the CPU 80. To improve heat conductivity between the block 10 and the CPU 80, thermal interface material (not shown) such as thermal grease is filled between the bottom surface 124 of the basewall 12 and the outer surface of the CPU 80. The evaporating section 32 of the heat pipe 30 is received in the space 13 of the block 10. The bottom contacting surface 36 of the heat pipe 30 directly contacts with the top surface 122 of the basewall 12. The top contacting surface 36 of the heat pipe 30 thermally contacts with the fin unit 90. Before mounting the heat dissipation device to the CPU 80, the heat pipe 30, the fin unit 90 and the block 10 can be joined together by soldering. Screws 100 extend through the mounting holes 540 of the mounting portions 54 of the clips 50 to screw the heat dissipation device on the circuit board 70. Thus the heat dissipation device is assembled to the CPU 80 to dissipate heat therefrom.

During operation of the heat dissipation device, the heat generated by the CPU 80 is conducted to the basewall 12 of the block 10 timely and evenly. The working fluid of the heat pipe 30 evaporates into vapor when the working fluid absorbs heat from the block 10. The vapor moves from the evaporating section 32 to the condensing section 34 to dissipate the heat, whereby the vapor cools and condenses at the condensing section 34. The condensed working fluid returns to the evaporating section 32 via a capillary force generated by the wick structure. From the evaporating section 32, the fluid is evaporated again to thereby repeat the heat transfer from the evaporating section 32 to the condensing section 34. By this way, the working fluid can absorb/release amounts of heat, thus transporting it from one place to another. The heat generated by the CPU 80 is thus transferred from the heat pipe 30 to the fin unit 90 almost immediately. After the forced airflow (the arrow shown in FIG. 1) generated by the fan flows into the flow channels 92 of the fin unit 90, the heat can be efficiently carried away by airflow. Therefore, the heat of the CPU 80 can be dissipated immediately.

For the paraboloidal-shaped basewall 12 of the block 10, when the heat dissipation device is mounted on the CPU 80, the force between the left and right portions 127, 128 and the clips 50 is larger than that of the central portion 126 of the block 10. However, the left and right portions 127, 128 are higher than the central portion 126, thus the left and right portions 127, 128 need relatively larger force to generate relatively larger elastic deformation. Thus bottom surface 124 of the block 10 is bent to be flat. Therefore the pressure the left and right portions 127, 128 put on the peripheral portion of the CPU 80 is approximately the same as that of the central portion 126 of the block 10 putting on the central portion of the CPU 80. In other words, the pressure that the block 10 puts on the CPU 80 is approximately even across the CPU 80. Every portion of the basewall 12 of the block 10 attaches to the CPU 80 intimately. Thus the heat generated by the CPU 80 is evenly conducted to every portion of the block 10. The heat of the central portion of the CPU 80 can be dissipated timely and hotspots on the CPU 80 in the central portion can be avoided, improving the efficiency and safety of the CPU 80. In other words, when the block 10 is mounted to the CPU 80 with the screws 100 fixing the clips 50 to the circuit board 70, the screwing-in force exerted by the screws 100 bends the left and right portions 127, 128 of the bottom surface 124 of the base wall 12 downwardly to cause the bottom surface 124 to be flat. Accordingly, the bottom surface 124 can have an intimate contact with the outer surface of the CPU 80. Thus, heat generated by the hotspots of the CPU 80 can be immediately dissipated.

As the pressure put on each portion of the CPU 80 depends on the shape of the block 12, the block 10 can be configured to other shapes to adapt to different kinds of CPUs. For example, by increasing the curvature of the block 10, the distance between the central portion 126 and the peripheral portion of the block 10 increases. Thus the pressure putting on the central portion of the CPU 80 can be further improved. The block 10 attaches to the CPU 80 more intimately, and the thermal resistance therebetween is further decreased. This is especially adaptable to dual-core CPUs which generate more heat. Also the curvature of the block 10 can be decreased to adapt to a heat generating component which generates a relatively smaller amount of heat. Thus as long as the bottom surface of the block is convex-shaped, which has a central portion lower than a peripheral portion, the pressure put on the central portion of the CPU by the central portion of the block can be increased. Also the bottom surface of the basewall can be spherical-shaped, cylinder-shaped and the like.

Alternatively, the sidewalls 14 of the block 10 can extend at a slant. For example, each sidewall extends upwardly and outwardly from the basewall. Cooperatively the sidewalls and the basewall can define a space expanding along the extending direction thereof. The distance between each sidewall and the axis X-X gradually increases along the direction away from the basewall. Alternatively, the sidewalls can extend upwardly and inwardly from the basewall, and thus form a space expanding along a reverse direction of the extending direction of the sidewalls.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat dissipation device comprising:
a thermal attach block having a convex bottom surface for being thermally attached to a heat generating component to absorb heat therefrom, and a top surface opposite to the bottom surface;
a heat pipe having an evaporating section being thermally attached to the top surface of the block, and a condensing section extending outwardly from the evaporating section; and
a fin unit being thermally attached to the condensing section of the heat pipe;
wherein the thermal attach block comprises a basewall forming the bottom surface at a bottom side thereof, and a pair of sidewalls each formed at one of two opposite sides of the basewall;
wherein the basewall and the sidewalls cooperatively define a space for receiving the evaporating section of the heat pipe therein; and
wherein the sidewalls extend upwardly and outwardly from the basewall, and a distance between the sidewalls gradually increases along the extending direction of the sidewalls.

2. The heat dissipation device of claim 1, further comprising a pair of flanges, each flange extending outwardly from a top end of one of the sidewalls.

3. The heat dissipation device of claim 2, further comprising a clip engaging with each of the flanges for locking the heat dissipation device with a circuit board.

4. The heat dissipation device of claim 3, wherein the clip is T-shaped.

5. The heat dissipation device of claim 3, wherein the clip fixedly engages with each of the flanges by one of riveting and soldering.

6. The heat dissipation device of claim 1, wherein the bottom surface of the basewall has one of the following shapes: a spherical shape, a cylinder shape, and a paraboloidal shape.

7. The heat dissipation device of claim 1, wherein the heat pipe fixedly engages with the block by soldering.

8. A thermal attach block for thermally interconnecting a heat radiator to a heat generating device, the block comprising a basewall having a convex bottom surface for being thermally attached to the heat generating device, wherein a pair of sidewalls each are formed at one of two opposite sides of the basewall, each sidewall extends upwardly from one of the two opposite sides of the basewall, and a flange extends transversely and outwardly from each of the sidewalls, a clip engaging with the flange for locking the block to the heat generating device.

9. The block of claim 8, wherein the bottom surface is symmetric to a central axis of the basewall.

10. The block of claim 9, wherein the bottom surface of the basewall has a paraboloidal shape.

11. The block of claim 8, wherein the sidewalls extend at a slant from the basewall, a distance between the sidewalls gradually increases along the extending direction of the sidewalls.

12. The block of claim 9, wherein the bottom surface of the basewall has a cylinder shape.

13. The block of claim 9, wherein the bottom surface of the basewall has a spherical shape.

* * * * *

UNITED STATES PATENT AND TRADEMARK OFFICE
CERTIFICATE OF CORRECTION

PATENT NO. : 7,606,036 B2 Page 1 of 1
APPLICATION NO. : 11/308916
DATED : October 20, 2009
INVENTOR(S) : Hwang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 770 days.

Signed and Sealed this

Fifth Day of October, 2010

David J. Kappos
*Director of the United States Patent and Trademark Office*